United States Patent
Hoshikawa et al.

(10) Patent No.: US 11,674,238 B2
(45) Date of Patent: Jun. 13, 2023

(54) CRUCIBLE FOR GROWING METAL OXIDE SINGLE CRYSTAL

(71) Applicant: Fujikoshi Machinery Corp., Nagano (JP)

(72) Inventors: Keigo Hoshikawa, Nagano (JP); Takumi Kobayashi, Nagano (JP); Yoshio Otsuka, Nagano (JP)

(73) Assignee: FUJIKOSHI MACHINERY CORP., Nagano (JP)

( * ) Notice: Subject to any disclaimer, the term of this patent is extended or adjusted under 35 U.S.C. 154(b) by 0 days.

(21) Appl. No.: 17/158,652

(22) Filed: Jan. 26, 2021

(65) Prior Publication Data

US 2021/0269940 A1  Sep. 2, 2021

(30) Foreign Application Priority Data

Feb. 27, 2020 (JP) .............................. JP2020-031099

(51) Int. Cl.
  C30B 35/00 (2006.01)
  C30B 29/16 (2006.01)
(52) U.S. Cl.
  CPC ............ C30B 35/002 (2013.01); C30B 29/16 (2013.01)
(58) Field of Classification Search
  CPC .......... B22D 7/005; B23K 9/00; C30B 15/10; C30B 29/20; C30B 35/002; C30B 11/002; C30B 29/16
  See application file for complete search history.

(56) References Cited

U.S. PATENT DOCUMENTS

| 2,781,411 A * | 2/1957 | Geffcken .................. C03B 5/06 373/29 |
| 2004/0261691 A1* | 12/2004 | Doguchi ............... C30B 11/006 117/83 |
| 2008/0127885 A1* | 6/2008 | Hagi ....................... C30B 29/42 117/209 |
| 2018/0251908 A1* | 9/2018 | Hoshikawa ............. C30B 29/30 |
| 2019/0211470 A1* | 7/2019 | Kizaki .................... C30B 15/10 |

FOREIGN PATENT DOCUMENTS

| JP | 56102393 A | * | 8/1981 | ............. B23K 31/06 |
| JP | H2145494 | | 6/1990 | |
| JP | 2017193466 | | 10/2017 | |
| RU | 2017 113 355 | | 10/2018 | |

OTHER PUBLICATIONS

European Patent Office, English computer translation of JP 56102393 (Year: 2021).*
Official Notification of Examination Results dated Oct. 25, 2021 in Russian Application No. 2021104938/05 (010857).

* cited by examiner

Primary Examiner — Matthew J Song
(74) Attorney, Agent, or Firm — Stephen J. Weyer, Esq.; Stites & Harbison, PLLC

(57) ABSTRACT

A crucible for growing a metal oxide single crystal is provided that can facilitate the balance between the thickness and the strength (hardness) of the constant diameter portion of the crucible and is capable of performing growth of a crystal having a large diameter. The crucible according to the present invention is a crucible for growing a metal oxide single crystal, including a reinforcing belt material provided on an outer periphery of a constant diameter portion of the crucible. It is possible that the crucible has an upper portion having a thickness that is smaller than a thickness of a lower portion of the crucible, and the upper portion of the crucible is the constant diameter portion.

6 Claims, 5 Drawing Sheets

FIG.4A
FIG.4B
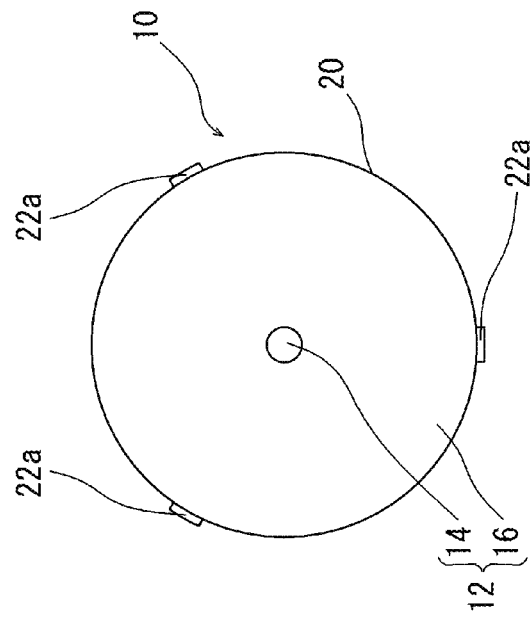
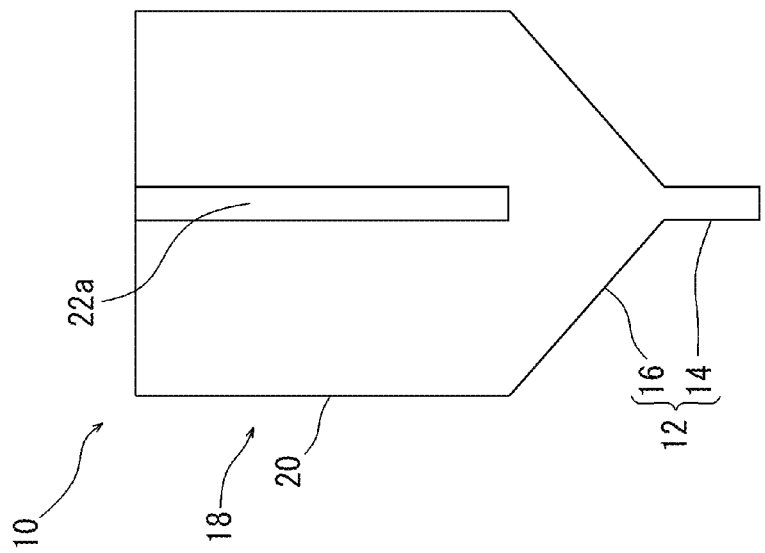

CRUCIBLE FOR GROWING METAL OXIDE SINGLE CRYSTAL

CROSS-REFERENCE TO RELATED APPLICATION

This application is based upon and claims the benefit of priority of the prior Japanese Patent Application No. 2020-031099, filed on Feb. 27, 2020, and the entire contents of which are incorporated herein by reference.

TECHNICAL FIELD

The present invention relates to a crucible for growing a metal oxide single crystal.

BACKGROUND ART

PTL 1 (JP-A-2017-193466) describes a production method of a single crystal of gallium oxide (particularly a $\beta$-$Ga_2O_3$ single crystal, the following description will be made for a $\beta$-$Ga_2O_3$ single crystal). The method described in PTL 1 grows a $\beta$-$Ga_2O_3$ single crystal by the vertical Bridgman method (VB method) or the vertical temperature gradient solidification method using a thin seed crucible formed of a platinum-rhodium (Pt—Rh) alloy in an oxidative atmosphere with a crystal growing equipment. A Pt—Rh alloy (particularly the alloy having a Rh content of from 10 to 30 wt %) has a high melting point of 1,800° C. or more and is suitable for growing a $\beta$-$Ga_2O_3$ single crystal at a high temperature.

SUMMARY OF INVENTION

Technical Problem

A crucible for growing a metal oxide single crystal, such as a $\beta$-$Ga_2O_3$ single crystal, is demanded to have a small crucible thickness from the standpoint of the reduction of damages to the single crystal due to the thermal stress between the crucible and the single crystal in the crystal growth and the ease in stripping the crucible in taking out the single crystal.

As for the crucible for growing a $\beta$-$Ga_2O_3$ single crystal having a diameter of 2 inches, a crucible having a thickness of from 0.1 mm to 0.2 mm for the upper portion (i.e., the constant diameter portion) and a thickness of from 0.15 mm to 0.3 mm for the lower portion (i.e., the seed portion and the diameter increasing portion) can be used.

As for the crucible for a single crystal having a large diameter of 4 inches or more, however, the crucible having the aforementioned thickness cannot withstand the weight of the crystal melt and may undergo deformation or breakage due to the small thickness thereof, which may result in outflow of the crystal melt in the worst case.

In the case where the crucible has a too large thickness, on the other hand, there is an issue that the crucible becomes harder to deteriorate the stripping capability between the crucible and the crystal in cooling the crystal, which tends to cause crystal defects, such as deformation and cracks, in the crystal.

Solution to Problem

In response to the above issue, one or more aspects of the present invention are directed to a crucible for growing a metal oxide single crystal that can facilitate the balance between the thickness and the strength (hardness) of the constant diameter portion of the crucible and is capable of performing growth of a crystal having a large diameter.

A crucible according to the present invention is a crucible for growing a metal oxide single crystal, including a reinforcing belt material provided on an outer periphery of a constant diameter portion of the crucible.

It is possible that the crucible has an upper portion having a thickness that is smaller than a thickness of a lower portion of the crucible, and the upper portion of the crucible is the constant diameter portion.

It is possible that the upper portion of the crucible has a thickness of approximately from 0.1 to 0.2 mm, and the lower portion of the crucible has a thickness of approximately from 0.15 to 0.3 mm.

It is possible that the reinforcing belt material includes belt materials that extend in an axial direction of the crucible, and the plural belt materials provided with regular intervals in a circumferential direction of the crucible.

It is possible that the reinforcing belt material includes one or plural belt material provided in a ring form on the outer periphery of the constant diameter portion.

It is possible that the belt material in a ring form is provided on at least one of an upper part of the outer periphery and a lower part of the outer periphery of the constant diameter portion.

It is possible that the reinforcing belt material is provided on the outer periphery of the constant diameter portion through welding, adhesion, fusion bonding, or compression bonding.

It is also possible that the reinforcing belt material including the belt material in a ring form is provided closely in contact with the outer periphery of the constant diameter portion.

The crucible is suitable for a crucible for growing a gallium oxide single crystal by the VB method in an oxidative atmosphere, and in this case, it is preferred that the crucible is formed of a Pt—Rh alloy having a rhodium compositional proportion of from 10 to 30 wt %.

Advantageous Effects of Invention

With the crucible for growing a metal oxide single crystal according to the present invention, the constant diameter portion can be appropriately reinforced with the reinforcing belt material provided on the outer periphery of the constant diameter portion even though the constant diameter portion is formed to have a small thickness, thereby retaining a suitable strength for the constant diameter portion, and therefore, the crucible can be prevented from undergoing deformation as much as possible even in the case where the crucible is exposed to a high temperature in a growing furnace, is slightly softened, and receives gravity from the melt, in the growth of a crystal having a large diameter of 4 inches or more.

Furthermore, in the case where the crucible having a larger expansion coefficient than the single crystal shrinks through cooling, since the flexibility of the portion thereof having no reinforcing belt material existing thereon is retained, the stress applied to the single crystal can be relaxed due to the presence of the portion with the constant diameter portion having a small thickness, and thus the occurrence of crystal defects, such as deformation and cracks of the single crystal, can be prevented as much as possible.

BRIEF DESCRIPTION OF DRAWINGS

FIGS. 4A and 4B are explanatory views of the crucible having only the axial belt material.

DESCRIPTION OF EMBODIMENTS

A preferred embodiment of the present invention will be described below with reference to the attached drawings.

Figure 1:
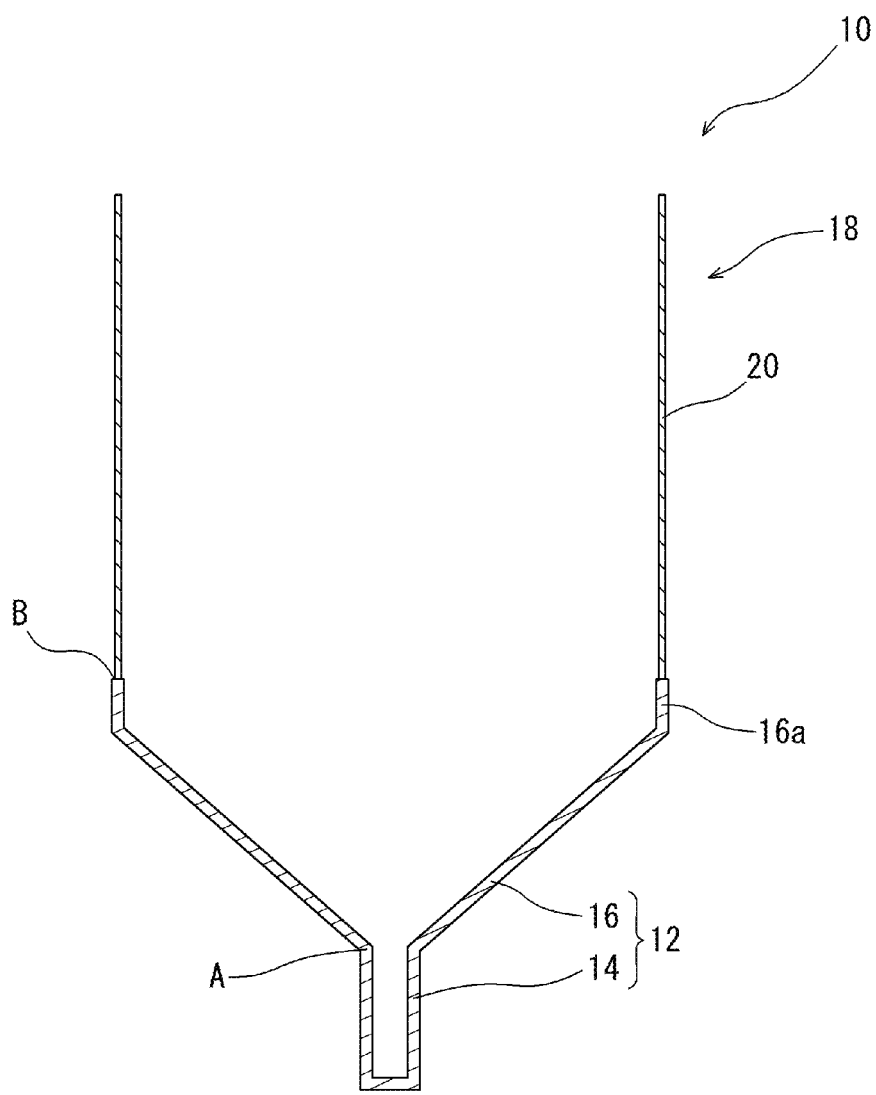
FIG. 1 is a cross sectional view of a crucible according to the embodiment (in which the reinforcing belt material is omitted).
Figure 2A:
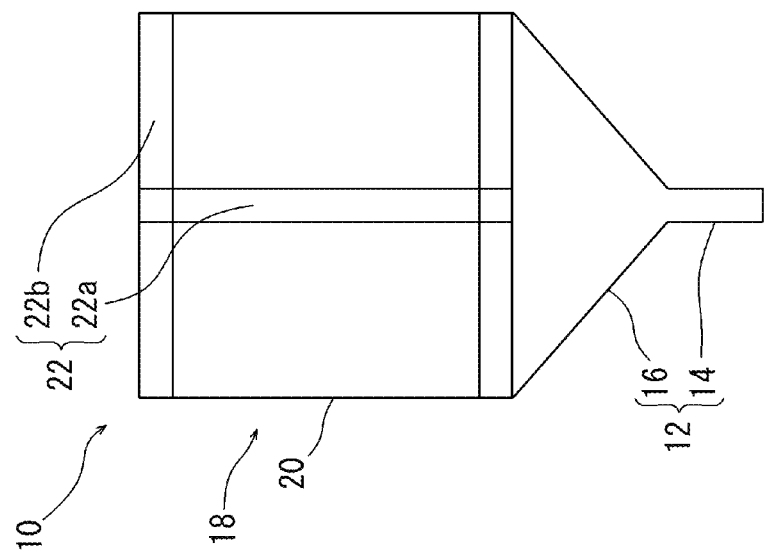
FIGS. 2A and 2B are explanatory views of a crucible according to the embodiment.
Figure 2B:
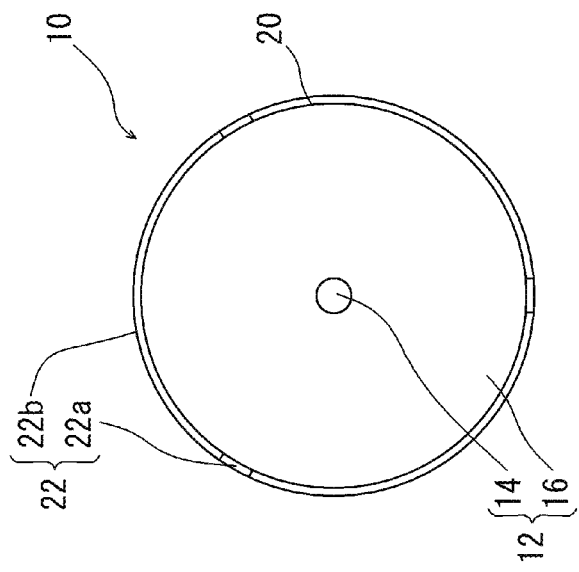

FIG. 1 is a cross sectional view of a crucible (i.e., a thin seed crucible, provided that the reinforcing belt material is omitted in FIG. 1) 10 according to the embodiment. FIGS. 2A and 2B are explanatory views of the crucible 10 having the reinforcing belt material provided thereon.

The crucible 10 is a crucible for growing a single crystal of gallium oxide ($\beta$-$Ga_2O_3$) in an oxidative atmosphere by the vertical Bridgman method (VB method) or the vertical temperature gradient solidification method, and is formed of a platinum-rhodium alloy containing platinum as a major component.

The crucible 10 according to the present invention is not limited to the growth of a single crystal of gallium oxide ($\beta$-$Ga_2O_3$), and can be used as a crucible for growing other metal oxide single crystals.

In the following description, the crucible 10 that is used for growing a single crystal of gallium oxide ($\beta$-$Ga_2O_3$) is described.

The equipment for growing a gallium oxide single crystal used may be, for example, the crystal growing equipment in an oxidative atmosphere described in JP-A-2017-193466.

The crucible 10 includes a lower portion 12 including a small diameter portion 14 having a cylindrical shape with a bottom, in which a seed crystal is housed with a stable position, and a diameter increasing portion 16 extending from the upper end of the small diameter portion 14 upward with increasing the diameter thereof, and an upper portion 18 including a constant diameter portion (having a diameter corresponding to the target crystal diameter) 20 having a large diameter extending from the upper part of the diameter increasing portion 16 upward in a cylindrical shape. The small diameter portion 14 and the constant diameter portion 20 each form a cylindrical shape.

The thin seed crucible 10 has an anomalous shape, and thus is formed by bonding the diameter increasing portion 16 to the upper end (site A) of the small diameter portion 14 through welding, and bonding the constant diameter portion 20 to the upper part (site B) of the diameter increasing portion 16 through welding. The bottom and the cylindrical part of the small diameter portion 14 are also bonded through welding. It may be difficult to weld the constant diameter portion 20 to the upper end surface of the diameter increasing portion 16 having a funnel shape, and therefore it is preferred that a cylindrical portion 16a having a constant diameter having a low height is formed as the upper part of the diameter increasing portion 16, and the cylindrical constant diameter portion 20 is welded to the upper end (site B) of the cylindrical portion 16a. The cylindrical portion 16a can be readily formed through drawing.

In the embodiment, the upper portion 18 of the crucible is formed to have a thickness that is smaller than the thickness of the lower portion 12 of the crucible. The thickness of the upper portion 18 of the crucible may be, for example, from 0.1 to 0.2 mm, and the thickness of the lower portion 12 of the crucible may be, for example, from 0.15 to 0.3 mm.

The crucible 10 as a crucible for growing a single crystal of gallium oxide ($\beta$-$Ga_2O_3$) may be formed of a Pt—Rh alloy having a Rh content of from 10 to 30 wt % (preferably from 10 to 20 wt %). In alternative, a Pt—Ir alloy may be used.

In the embodiment, as shown in FIGS. 2A and 2B, reinforcing belt materials 22 are provided on the outer periphery of the constant diameter portion 20 of the crucible 10, so as to reinforce the strength of the constant diameter portion 20 having a small thickness.

In the embodiment, the reinforcing belt materials 22 is constituted by a belt material 22a extending in the axial direction of the crucible 10 on the outer periphery of the constant diameter portion 20 (which may be hereinafter referred to as an axial direction belt material) and a belt material 22b provided in a ring form on the outer periphery of the constant diameter portion 20 (which may be hereinafter referred to as a circumferential direction belt material).

In FIGS. 2A and 2B, the circumferential direction belt material 22b is spaced from the outer periphery of the constant diameter portion 20 for the sake of drawing, but the circumferential direction belt material 22b is actually in close contact with the outer periphery of the constant diameter portion 20.

While the axial direction belt material 22a and the circumferential direction belt material 22b may be overlapped with whichever being on top, it is preferred that the circumferential direction belt material 22b is overlapped on the axial direction belt material 22a, for preventing the end part of the axial direction belt material 22a from being uplifted.

Three axial direction belt materials 22a are provided on the outer periphery of the constant diameter portion 20 with regular intervals in the circumferential direction.

The circumferential direction belt materials 22b are provided on the upper part and the lower part of the outer periphery of the constant diameter portion 20.

The width of the belt material 22 is preferably approximately from several millimeters to several tens millimeters, and the thickness thereof is preferably approximately from 0.1 mm to 0.4 mm.

The belt material 22 is preferably the same material as the crucible 10, but may be a different material.

The belt material 22 may be fixed to the outer periphery of the constant diameter portion 20 of the crucible 10 through welding, adhesion, fusion bonding, or compression bonding.

Figure 3:
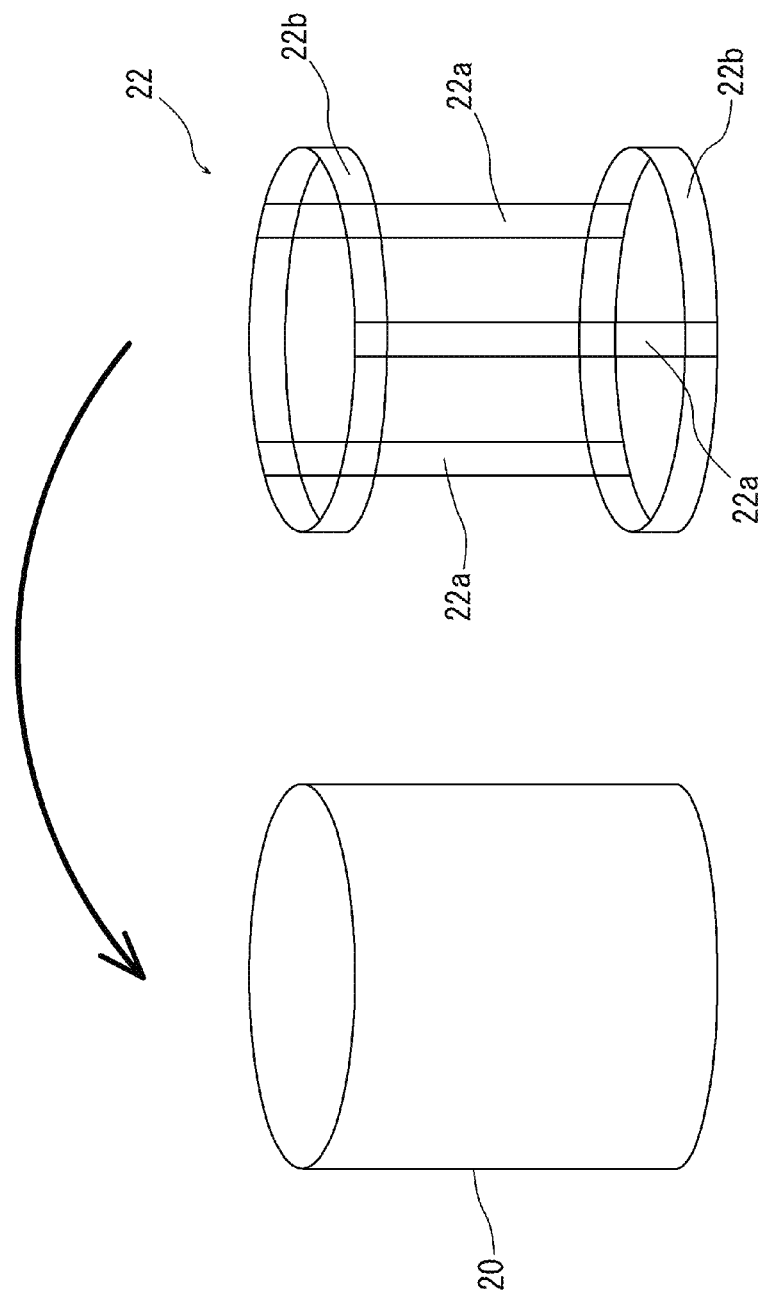
FIG. 3 is an explanatory view of the situation where the reinforcing belt material is installed in the constant diameter portion.

In alternative, as shown in FIG. 3, it is possible that the belt material 22 is fabricated in advance to a three-dimensional structure by welding three axial direction belt materials 22a and two top and bottom circumferential direction belt materials 22b in a ring form, and the three-dimensional belt material 22 is installed to be closely in contact with the outer periphery of the constant diameter portion 20 of the crucible 10 (i.e., the constant diameter portion 20 is pressed into the circumferential direction belt materials).

Both the axial direction belt material 22a and the circumferential direction belt material 22b suppress the constant diameter portion 20 from expanding outward.

In the embodiment, the axial direction belt material 22a and the circumferential direction belt material 22b are fixed to the outer periphery of the constant diameter portion 20 of the crucible 10 through welding or the like, or installed to be closely in contact therewith, and thus the constant diameter portion 20 having a small thickness can be appropriately reinforced. Accordingly, since the portion reinforced with the belt material 22 retains a suitable strength, the crucible 10 can be prevented from undergoing deformation as much as possible even in the case where the crucible is exposed to a high temperature (for example, 1,830° C.) in a growing furnace, is slightly softened, and receives gravity from the melt, in the growth of a crystal having a large diameter of 4 inches or more.

On the other hand, in the case where the crucible having a larger expansion coefficient than the single crystal shrinks through cooling, since the flexibility of the portion having no belt material 22 existing thereon is retained, the stress applied to the single crystal can be relaxed due to the presence of the constant diameter portion 20 having a small thickness, and thus the occurrence of crystal defects, such as deformation and cracks of the single crystal, can be prevented as much as possible.

Furthermore, the constant diameter portion 20 has a small thickness, and thus after growing the crystal, can be readily stripped off from the crystal.

The configuration of the belt material 22 may be appropriately changed depending on the size and the kind of the single crystal.

For example, the belt material 22 may be only the axial direction belt material 22a (FIGS. 4A and 4B). The number thereof may be appropriately selected.

Figure 5:
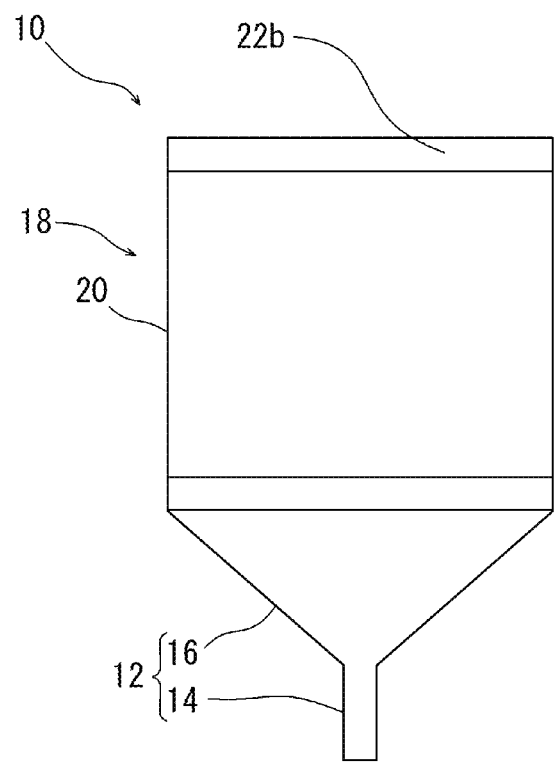
FIG. 5 is an explanatory view of the crucible having only the circumferential direction belt material.

In alternative, the belt material 22 may be only the circumferential direction belt material 22b (FIG. 5). In this case, only the circumferential direction belt material 22b on the upper part of the constant diameter portion 20 may be used.

The deformation of the crucible 10 at a high temperature frequently occurs mainly at the upper end of the crucible 10 (opening edge) deformed in the form of petals, and therefore, the circumferential direction belt material 22b provided only at the upper part of the constant diameter portion 20 is effective therefor.

Furthermore, the belt material 22 may be provided on the outer periphery of the constant diameter portion 20 in a diagonal direction, in the form of lattice, or in an appropriate shape depending on the situation.

While the crucible 10 in the embodiment has the upper portion 18 of the crucible having a smaller thickness than the thickness of the lower portion 12 of the crucible, the crucible is not limited thereto, and the thicknesses of the upper portion 18 and the lower portion 12 of the crucible may be approximately the same as each other. Even in this case, the thickness of the constant diameter portion 20 may not necessarily be increased more than necessary due to the reinforcement by the reinforcing belt member 22 provided on the outer periphery of the constant diameter portion 20, and thus the strength and the flexibility thereof can be secured. Furthermore, the overall shape of the crucible 10 may not necessarily be the shape of the thin seed crucible shown in FIG. 1, and may be a crucible in the ordinary cup form (not shown in the figures).

EXAMPLES

Example of Crystal Growth of $\beta$-$Ga_2O_3$

A unidirectional solidification $\beta$-$Ga_2O_3$ crystal was tried to grow in a VB furnace.

The crucible 10 used was a crucible shown in FIG. 1 having an opening diameter of 4 inches formed of a Pt—Rh alloy having a composition of 80 wt % of Pt and 20 wt % of Rh.

The thickness of the crucible 10 was 0.30 mm at the small diameter portion 14, 0.30 mm at the diameter increasing portion 16, and 0.15 mm at the constant diameter portion 20.

The reinforcing belt material 22 was formed of a Pt—Rh alloy having the same composition as the crucible, and was formed by fixing a belt material having a width of 10 mm and a thickness of 0.3 mm on the outer periphery of the constant diameter portion 20 through welding.

As a crucible of a comparative example, a crucible having the same composition and the same size as in the example, but having no reinforcing belt material was used.

A seed crystal and a $\beta$-$Ga_2O_3$ sintered body raw material were charged in the crucible formed of the Pt—Rh alloy, and totally melted in a high temperature furnace in an oxidative atmosphere at 1,800° C. or more with a temperature distribution set to have a temperature gradient around the melting point of $\beta$-$Ga_2O_3$ (approximately 1,795° C.) of from 5 to 10° C./cm. Thereafter, the unidirectional solidification was performed through combination use of the movement of the crucible and the temperature decrease in the furnace. After cooling, the crucible was stripped off to take out the grown crystal.

In the case where the crucible 10 of the example was used, the crucible 10 underwent no deformation found after the crystal growth, and was readily stripped and removed off from the single crystal. The $\beta$-$Ga_2O_3$ single crystal obtained had substantially no crystal defect.

Figure 6:
FIG. 6 is a photograph (plane view) showing the situation where deformation occurs in the crucible of the comparative example.

In the case where the crucible of the comparative example was used, on the other hand, as shown in FIG. 6, at the time when the seed crystal and the $\beta$-$Ga_2O_3$ sintered body raw material were totally melted in the high temperature furnace in an oxidative atmosphere at 1,800° C. or more, particularly the opening edge of the crucible was deformed in the form of petals, and the melt leaked out, failing to perform the crystal growth.

What is claimed is:

1. A crucible for growing a gallium oxide single crystal by a VB method comprising:
   the crucible including a small diameter portion having a cylindrical shape with a bottom, a diameter increasing portion extending from an upper end of the small diameter portion upward with increasing a diameter thereof, and a constant diameter portion extending from an upper part of the diameter increasing portion upward in a cylindrical shape;
   the constant diameter portion, which is an upper portion, of the crucible having a thickness that is smaller than a thickness of the small diameter portion and the diameter increasing portion, which are a lower portion of the crucible; and
   a reinforcing belt material provided on an outer periphery of the constant diameter portion of the crucible;
   the reinforcing belt materials including three belt materials that extend in an axial direction of the crucible on the outer periphery of the constant diameter portion with regular intervals in the circumferential direction, and a plurality of belt materials extending in a circumferential direction provided in a ring formed on the outer periphery of the constant diameter portion, the reinforcing belt materials in a ring formed being provided on an upper part of the outer periphery and a lower part of the outer periphery of the constant diameter portion.

2. The crucible for growing a gallium oxide single crystal according to claim 1, wherein the constant diameter portion, which is the upper portion, of the crucible has a thickness of from 0.1 to 0.2 mm, and the small diameter portion and the diameter increasing portion, which are the lower portion, of the crucible have a thickness of from 0.15 to 0.3 mm.

3. The crucible for growing a gallium oxide single crystal according to claim 1, wherein the reinforcing belt material is provided on the outer periphery of the constant diameter portion through welding, adhesion, fusion bonding, or compression bonding.

4. The crucible for growing a gallium oxide single crystal according to claim 1, wherein the reinforcing belt material including the belt material in a ring form is provided closely in contact with the outer periphery of the constant diameter portion.

5. The crucible for growing a gallium oxide single crystal according to claim 1, wherein the crucible is a crucible by the VB method in an oxidative atmosphere.

6. The crucible for growing a gallium oxide single crystal according to claim 1, wherein the crucible is formed of a Pt—Rh alloy having a rhodium compositional proportion of from 10 to 30 wt %.

* * * * *